United States Patent
Han

(10) Patent No.: US 10,855,226 B1
(45) Date of Patent: Dec. 1, 2020

(54) QUADRATURE PASSIVE MIXER AND FREQUENCY DOWN CONVERTER FOR ENHANCING IIP2

(71) Applicant: THE INDUSTRY & ACADEMIC COOPERATION IN CHUNGNAM NATIONAL UNIVERSITY, Daejeon (KR)

(72) Inventor: Junghwan Han, Daejeon (KR)

(73) Assignee: THE INDUSTRY & ACADEMIC COOPERATION IN CHUNGNAM NATIONAL UNIVERSITY, Daejeon (KR)

( * ) Notice: Subject to any disclaimer, the term of this patent is extended or adjusted under 35 U.S.C. 154(b) by 0 days.

(21) Appl. No.: 16/923,505

(22) Filed: Jul. 8, 2020

(30) Foreign Application Priority Data

Oct. 11, 2019 (KR) .......................... 10-2019-0126470

(51) Int. Cl.
*H03D 7/14* (2006.01)
*H03K 5/00* (2006.01)

(52) U.S. Cl.
CPC ......... *H03D 7/1466* (2013.01); *H03D 7/1458* (2013.01); *H03K 5/00006* (2013.01)

(58) Field of Classification Search
None
See application file for complete search history.

(56) References Cited

U.S. PATENT DOCUMENTS

| 6,016,422 | A * | 1/2000 | Bartusiak | H03C 3/40 |
| | | | | 455/324 |
| 10,734,967 | B2 * | 8/2020 | Davis | H03H 7/06 |
| 2006/0039505 | A1 * | 2/2006 | Kim | H03D 7/1425 |
| | | | | 375/322 |
| 2008/0014896 | A1 * | 1/2008 | Zhuo | H03D 7/166 |
| | | | | 455/326 |
| 2014/0171007 | A1 * | 6/2014 | Nentwig | H03D 3/009 |
| | | | | 455/317 |
| 2015/0180643 | A1 * | 6/2015 | Shi | H03K 5/1565 |
| | | | | 375/343 |
| 2017/0359076 | A1 * | 12/2017 | Rafi | H03L 7/18 |

FOREIGN PATENT DOCUMENTS

KR          100672030 B1     1/2007

* cited by examiner

*Primary Examiner* — Cassandra F Cox
(74) *Attorney, Agent, or Firm* — Levenfeld Pearlstein, LLC

(57) ABSTRACT

Proposed is related to a quadrature passive mixer and a frequency down-converter for enhancing an input referred second-order intercept point (IIP2). More particularly, proposed is related to a quadrature passive mixer and a frequency down-converter for enhancing the IIP2 capable of improving the IIP2 by reducing a mismatch component of a mixer block used for frequency downconversion of a wireless communication system. Here, the frequency down-converter for improving the IIP2 according to the embodiment of the present invention includes an RF quadrature signal generator, an LO IQ signal generator, a 25% LO signal generator, an LO buffer, an I-quadrature mixer, and a Q-quadrature mixer. In addition, the I-quadrature mixer and the Q-quadrature mixer receive RF quadrature signals from the RF quadrature signal generator and selectively down-convert and output the RF quadrature signals according to the 25% duty-cycle LO signals applied from the LO buffer.

5 Claims, 11 Drawing Sheets

QUADRATURE PASSIVE MIXER AND FREQUENCY DOWN CONVERTER FOR ENHANCING IIP2

CROSS REFERENCE TO RELATED APPLICATION

The present application claims priority to Korean Patent Application No. 10-2019-0126470, filed Oct. 11, 2019, the entire contents of which is incorporated herein for all purposes by this reference.

BACKGROUND OF THE INVENTION

Field of the Invention

The present invention relates to a quadrature passive mixer and a frequency down-converter for enhancing an input referred second-order intercept point (IIP2). More particularly, the present invention relates to a quadrature passive mixer and a frequency down-converter for enhancing the IIP2 capable of improving the second-order nonlinearity by reducing a mismatch component of a mixer block used for frequency downconversion of a wireless communication system.

Description of the Related Art

In general, frequency division duplexing (FDD) having different transmission and reception frequencies is widely used in wireless communication systems. At this time, due to a limited isolation characteristics of a duplexer itself, there occurs a phenomenon in which a relatively larger transmitter signal compared to a signal being received leaks toward a receiver.

Such a transmission leakage signal is amplified by a low noise amplifier (LNA) at the receiver and is applied to a mixer block used for a frequency down-converter.

However, as an the second-order nonlinearity component generated due to a limited IIP2 characteristic of a mixer end is overlapped with the received signal, a signal-to-noise ratio (SNR) decreases. Therefore, in the case of the mixer used for the receiver in the wireless communication system, improvement of the IIP2 characteristic is required.

In general, causes of 2nd-order nonlinearity, that is, 2nd-order intermodulation products (IM2) of the mixer may be largely divided into three types. The first major cause is the threshold voltage (Vth) mismatches of transistors constituting mixer switches caused by the unbalanced size of the transistors. A second cause is unbalanced coupling components of leakage signals between RF input and local oscillator (LO) input, and a third cause is an mismatched LO alternating current (AC) coupling components through a LO signal path or a capacitor. Consequently, IM2 performance is affected due to the above causes.

Although all of the above causes are mostly caused by inherent inconsistencies in a semiconductor process, IM2 or IIP2 may be improved to some extent by appropriate floor planning or symmetric layout in design. However, in order to obtain sufficient sensitivity characteristics and the SNR required by the receiver, it is necessary to apply an additional circuit technique capable of improving the IIP2.

In addition, as described above, in the case of the IIP2, since it is mainly caused by mismatch characteristics of the mixer, a method of improving through a structural improvement method or a separate calibration method is applied.

At this time, when applying the calibration method, a method of finely adjusting mixer gate voltage Vg is applied to give an intentional asymmetric component. However, there is a problem in which the calibration method requires many tests by performing calibration on a sample-by-sample basis, thereby increasing the cost of the product.

The foregoing is intended merely to aid in the understanding of the background of the present invention, and is not intended to mean that the present invention falls within the purview of the related art that is already known to those skilled in the art.

DOCUMENTS OF RELATED ART

Patent Document

Korean Patent No. 10-0672030 (Publication date: Jan. 1, 2007)

SUMMARY OF THE INVENTION

Accordingly, the present invention has been made keeping in mind the above problems occurring in the related art, and the present invention is intended to solve the conventional shortcomings, that is, to improve an input referred second-order intercept point (IIP2) of a mixer block mainly used for frequency conversion of a wireless communication system. In addition, the purpose of the present invention is to improve various mismatch components that may occur in the mixer block in design without a separate calibration method.

In order to achieve the above objective, there may be provided a frequency converter according to an embodiment of the present invention, the frequency converter including: an RF quadrature signal generator; an LO IQ signal generator; a 25% LO signal generator; an LO buffer; an I-quadrature mixer; and a Q-quadrature mixer.

The RF quadrature signal generator RF quadrature signal generator may receive amplified signals from a low noise amplifier (LNA) and generate four RF quadrature signals with phase differences at intervals of 90 degrees. In addition, the LO IQ signal generator may generate in-phase (I) and quadrature (Q) local oscillator (LO) signals for frequency conversion of input signals.

In addition, the 25% LO signal generator may receive the signals generated by the LO IQ signal generator and generating 25% duty-cycle LO signals. In addition, the LO buffer may receive the signals generated by the 25% LO signal generator and selectively transmitting the signals to an I-quadrature mixer or a Q-quadrature mixer.

In addition, the I-quadrature mixer and Q-quadrature mixer may receive the RF quadrature signals from the RF quadrature signal generator and selectively frequency-converting the RF quadrature signals for output using the 25% duty-cycle LO signals applied from the LO buffer.

In addition, the I-quadrature mixer and Q-quadrature mixer may generate output signals by switching combinations of the four RF quadrature signals with phase differences at intervals of 90 degrees and the four LO quadrature signals with phase differences at intervals of 90 degrees and each are configured to generate the output signals of the same phase, by selectively combining the four RF quadrature signals generated by the RF quadrature signal generator and the four LO quadrature signals to each other.

As described above, the quadrature passive mixer and the frequency down-converter for enhancing the IIP2 according to the present invention has an effect wherein performance of 2nd-order intermodulation products (IM2) can be improved by reducing mismatch components occurring in the mixer block. In addition, there is an effect wherein the IIP2 of the mixer block can be improved.

BRIEF DESCRIPTION OF THE DRAWINGS

The above and other objectives, features, and other advantages of the present invention will be more clearly understood from the following detailed description when taken in conjunction with the accompanying drawings, in which.

DETAILED DESCRIPTION OF THE INVENTION

Figure 1:
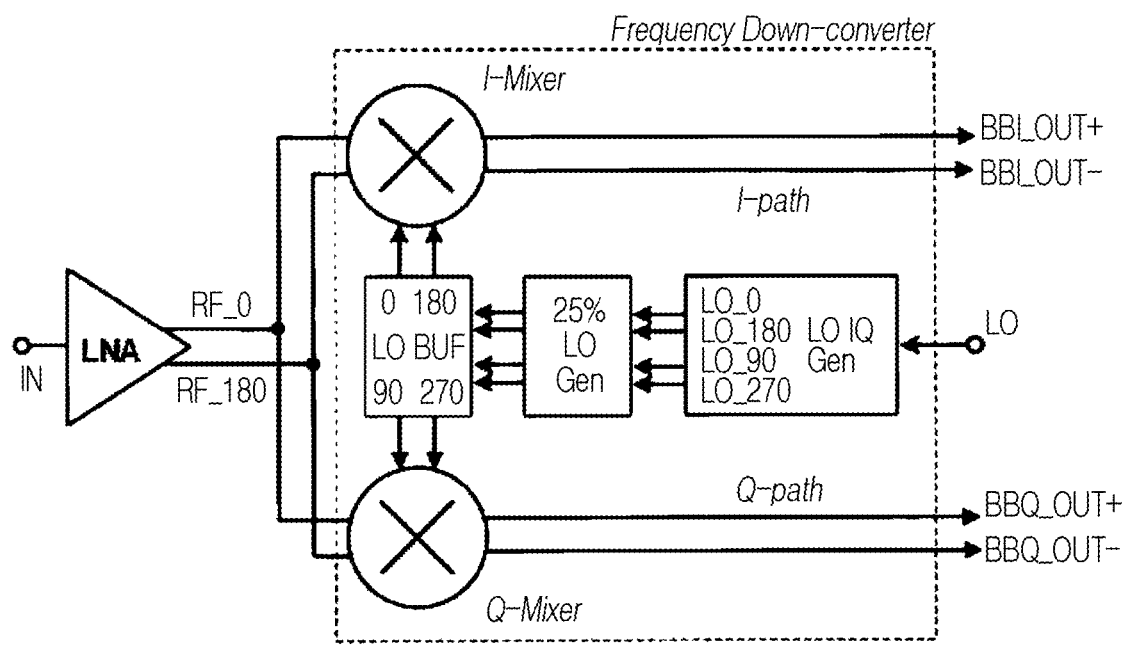
FIG. 1 is a block diagram showing a conventional frequency down-converter.

Hereinafter, exemplary embodiments of the present invention will be described in detail with reference to the accompanying drawings so that those skilled in the art to which the present invention pertains may easily practice the embodiments. However, the present invention may be implemented in many different forms and is not limited to the embodiments described herein. In addition, in order to clearly describe the present invention in the drawings, parts irrelevant to the description are omitted, and like reference numerals are attached to like parts throughout the specification.

Throughout the specification, when a part "includes" a certain component, this means that other components may be further included rather than excluding other components unless specifically stated to the contrary. In addition, terms such as " . . . unit", " . . . group", " . . . module", and the like described in the specification mean a unit that processes at least one function or operation, which may be implemented by hardware or software or a combination of the hardware and software.

Hereinafter, the present invention will be described in detail by explaining exemplary embodiments of the present invention with reference to the accompanying drawings.

The same reference numerals in each drawing denote the same members.

FIG. 1 is a block diagram showing a conventional frequency down-converter. That is, FIG. 1 is the block diagram showing a conventional IQ receiver frequency down-converter to which a 25% duty-cycle local oscillator (LO) is applied.

Generally, a frequency down-converter performs a role of frequency conversion in which a radio frequency (RF) signal, of a high frequency band, which is received through an antenna in a wireless communication system and then passed through a low noise amplifier (LNA), is converted into a signal of a baseband frequency that is a low frequency band.

At this time, performance of a mixer is determined by various evaluation factors such as a gain, a noise, linearity, power consumption, and the like of the mixer. In particular, a linearity characteristic of the mixer requires high linearity to minimize an effect on spurious signals in various frequency bands that may occur during frequency downconversion.

In addition, passive mixers having a gain of being less than one but having a high linearity characteristic are much used instead of an active mixer having an advantage in teams of the gain.

In addition, recently, instead of a 50% duty-cycle LO, a 25% duty-cycle LO signal, in which an additional 3 dB gain may be obtained by improving isolation between I and Q channels and an IQ cross talk phenomenon, is mainly applied. At this time, a separate 25% duty-cycle LO generator may be applied to the LO circuit.

Figure 2A:
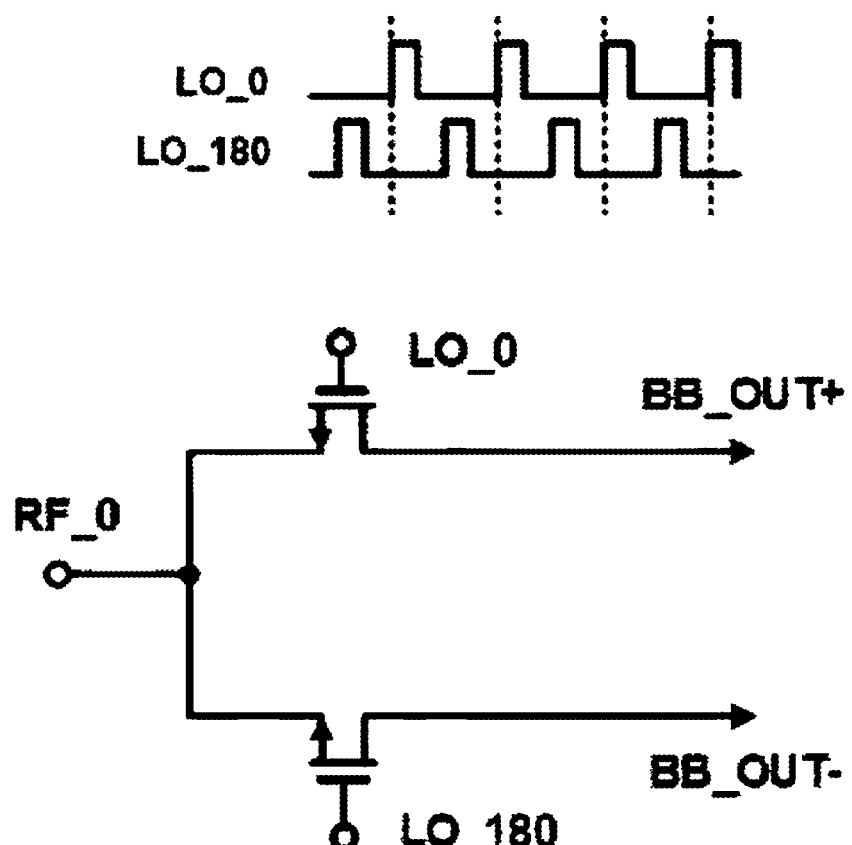
FIGS. 2A and 2B are circuit diagrams showing conventional passive mixers.
Figure 2B:
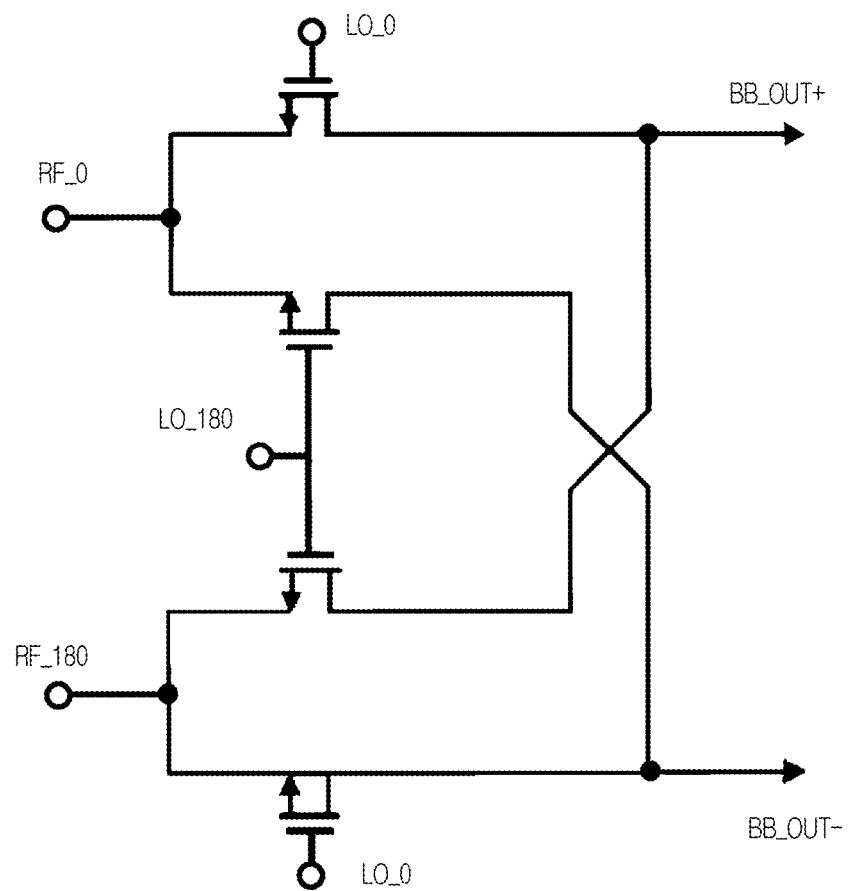

FIGS. 2A and 2B are circuit diagrams showing conventional passive mixers. That is, FIG. 2A is a circuit diagram showing a conventional single-balanced passive mixer using a 25% duty-cycle LO, and FIG. 2B is a circuit diagram showing a conventional double-balanced passive mixer (I-mixer) applied to a differential circuit using the 25% duty-cycle LO.

In general, when a separate calibration method is applied to improve an input referred second-order intercept point (IIP2) of the mixer, a method of finely tuning mixer gate voltage Vg using an IIP2 calibration digital-to-analog converter (DAC) to give an intentional asymmetric component is used.

However, when the mixer performs frequency downconversion of multiple frequency band signals, a separate calibration is required for each frequency band, and a different calibration value is required for each sample. This becomes a factor that increases the overall price due to the increase in the overall test time and the need for additional memory space to store the calibration values.

As described above, a frequency down-converter 10 according to an embodiment of the present invention may improve mismatch components caused by various factors without a separate calibration method. That is, a quadrature mixer structure that may improve a 2nd-order intermodulation product (IM2) component and the IIP2 characteristics is proposed.

Figure 3:
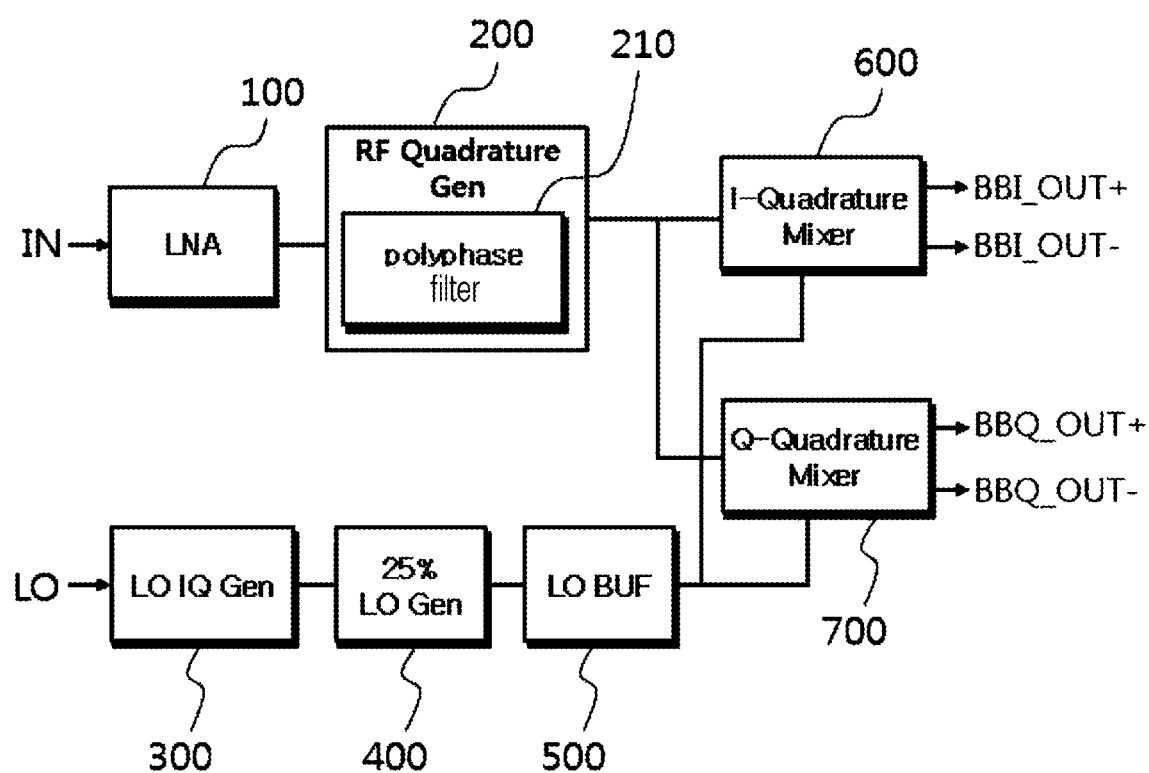
FIG. 3 is a block diagram showing a frequency down-converter according to an embodiment of the present invention.
Figure 4:
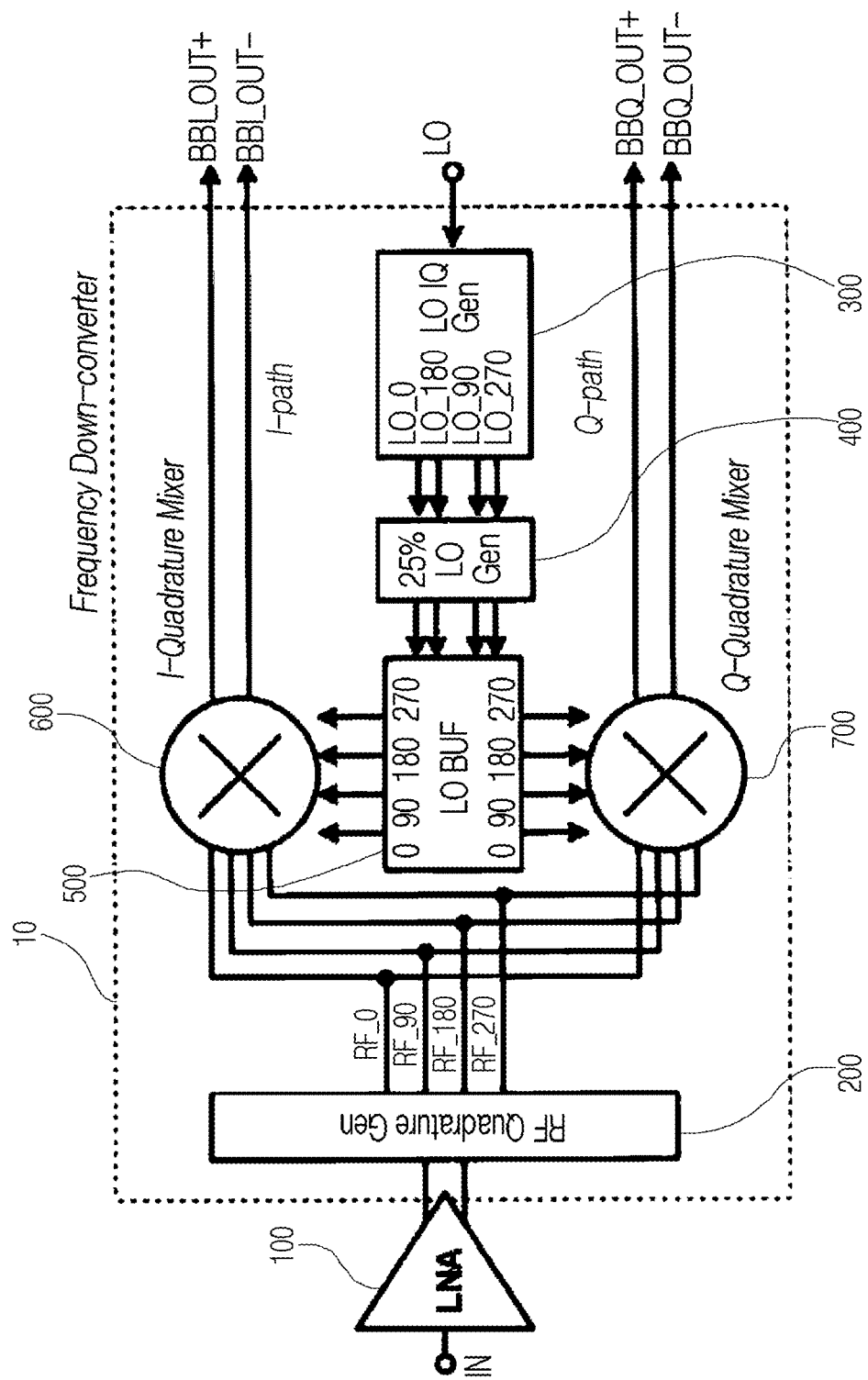
FIG. 4 is a functional block diagram showing a frequency down-converter according to the embodiment of the present invention.

FIG. 3 is a block diagram showing a frequency down-converter according to the embodiment of the present invention, and FIG. 4 is a functional block diagram showing a frequency down-converter 10 of a receiver of a wireless communication system using a quadrature mixer according to the embodiment of the present invention.

The frequency down-converter 10 for improving the IIP2 according to the embodiment of the present invention may include an RF quadrature signal generator 200, an LO IQ signal generator 300, a 25% LO signal generator 400, an LO buffer 500, an I-quadrature mixer 600, and a Q-quadrature mixer 700.

The RF quadrature signal generator 200 may receive amplified signals from a low noise amplifier (LNA) 100, thereby generating quadrature signals. At this time, the LNA 100 may amplify the RF signals of a high frequency band received through the antenna of the wireless communication system.

That is, the RF quadrature signal generator 200 may generate four RF quadrature input signals RF 0, RF 90, RF 180, and RF 270 with phase differences at intervals of 90 degrees. To this end, the RF quadrature signal generator 200 may include a polyphase filter 210.

Figure 5:
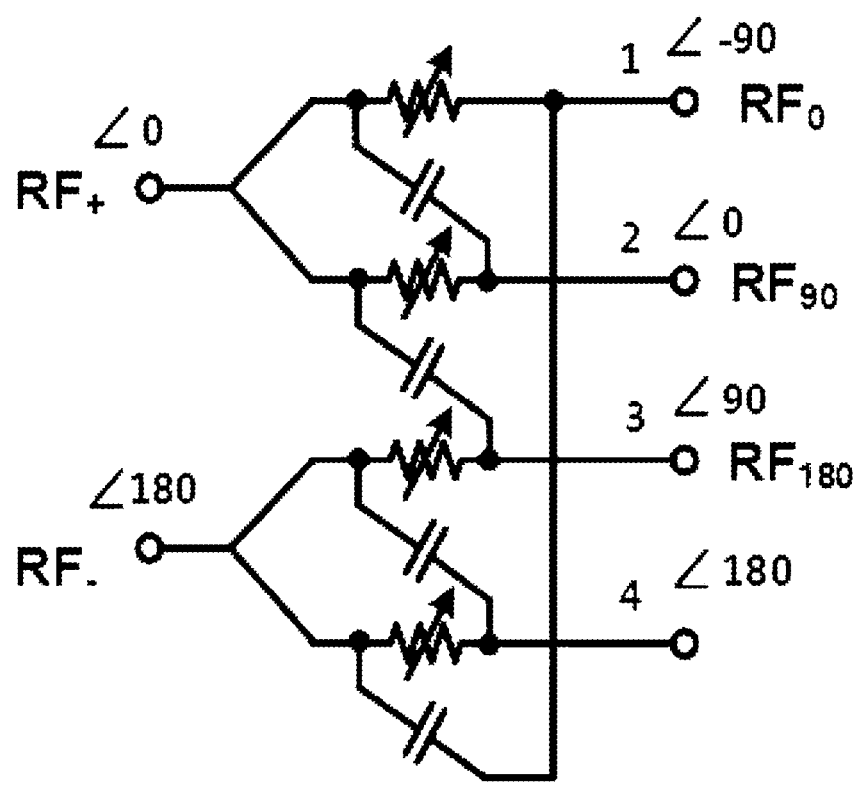
FIG. 5 is a circuit diagram showing a polyphase filter according to the embodiment of the present invention.

FIG. 5 is a circuit diagram showing a polyphase filter according to the embodiment of the present invention. That is, it is a circuit diagram showing a single-stage polyphase filter for receiving amplified signals from the LNA 100 and generating RF quadrature signals.

In addition, the LO IQ signal generator 300 may generate in-phase I and quadrature Q LO signals for the frequency downconversion of input signals received in the wireless communication system. In addition, the 25% LO signal generator 400 receives the signals generated by the LO IQ signal generator 300, thereby generating 25% duty-cycle LO signals.

In addition, the LO buffer 500 may receive signals generated by the 25% LO signal generator 400, thereby selectively transmitting the signals to the I-quadrature mixer 600 or the Q-quadrature mixer 700.

Figure 6A:
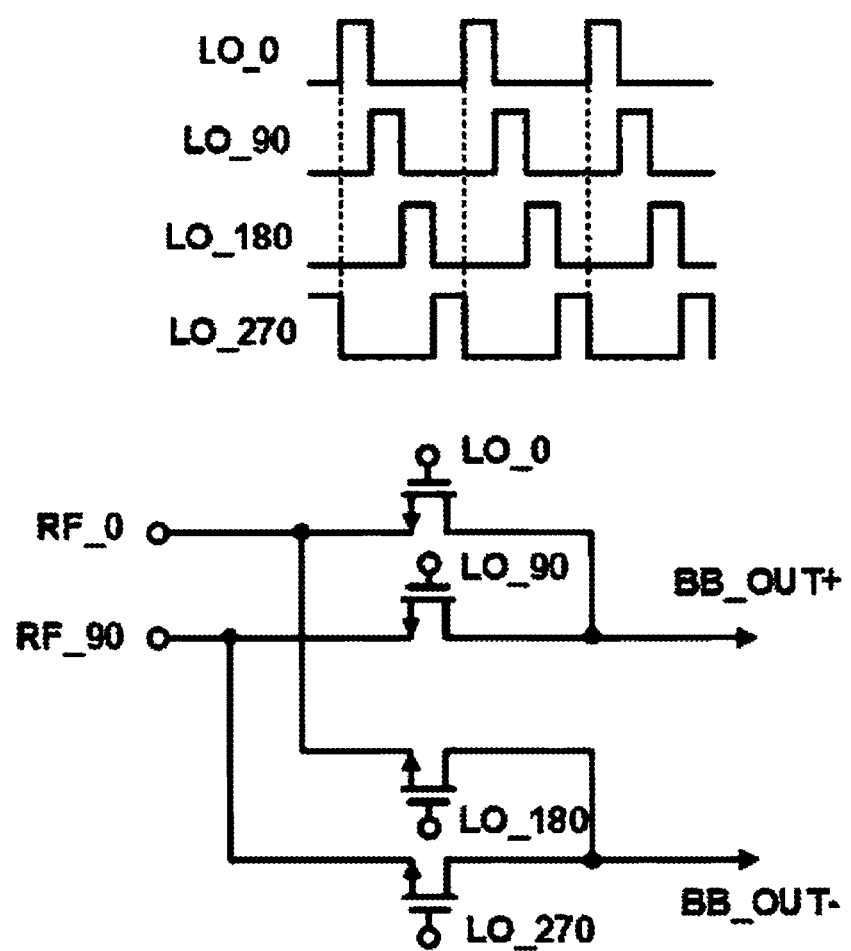
FIGS. 6A and 6B are circuit diagrams showing quadrature passive mixers according to the embodiment of the present invention.
Figure 6B:
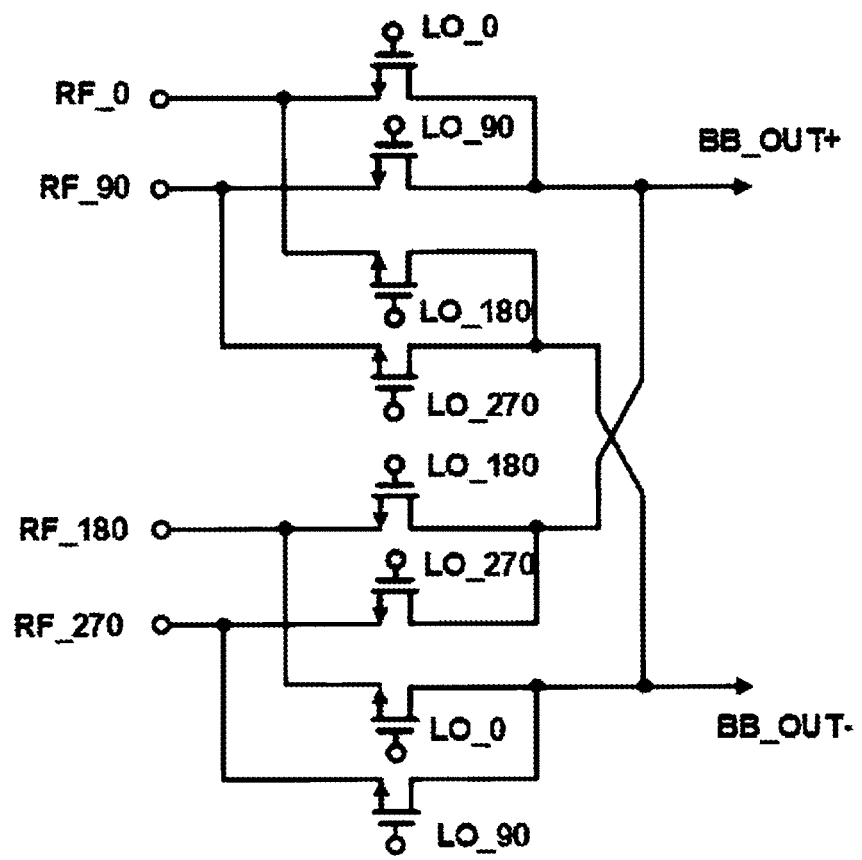

FIGS. 6A and 6B are circuit diagrams showing quadrature passive mixers according to the embodiment of the present invention. That is, FIG. 6A is a circuit diagram showing the quadrature passive mixer (I-mixer) to which the 25% duty-cycle LO is applied according to the embodiment of the present invention by improving the conventional single-balanced passive mixer.

In addition, FIG. 6B is a circuit diagram showing the quadrature double-balanced passive mixer (I-mixer) to which the 25% duty-cycle LO is applied according to the embodiment of the present invention.

As shown in FIG. 6A, the single-balanced quadrature passive mixer according to the embodiment of the present invention may be implemented by not only including mixing switching combinations of RF_0 and LO_0, and RF_0 and LO_180 but also additionally including mixing switching combinations of RF_90 and LO_90, and RF_90 and LO_270 in order to generate the output of BB_OUT+ and BB_OUT−, each having the same phase.

Here, the RF_0, RF_90, RF_180, and RF_270 are four RF quadrature input signals with phase differences at intervals of 90 degrees, and the LO_0, LO_90, LO_180, and LO_270 are four LO quadrature signals with phase differences at intervals of 90 degrees.

In addition, as shown in FIG. 6B, the double-balanced quadrature passive mixer according to the embodiment of the present invention may perform mixing switching combinations of RF_0 and LO_0, RF_180 and LO_180, RF_90 and LO_90, and RF_270 and LO_270 in order to generate the BB_OUT+ output of an output end and may perform mixing switching combinations of RF_0 and LO_180, RF_180 and LO_0, RF_90 and LO_270, and RF_270 and LO_90 in order to generate the BB_OUT− output of the output end.

Figure 7:
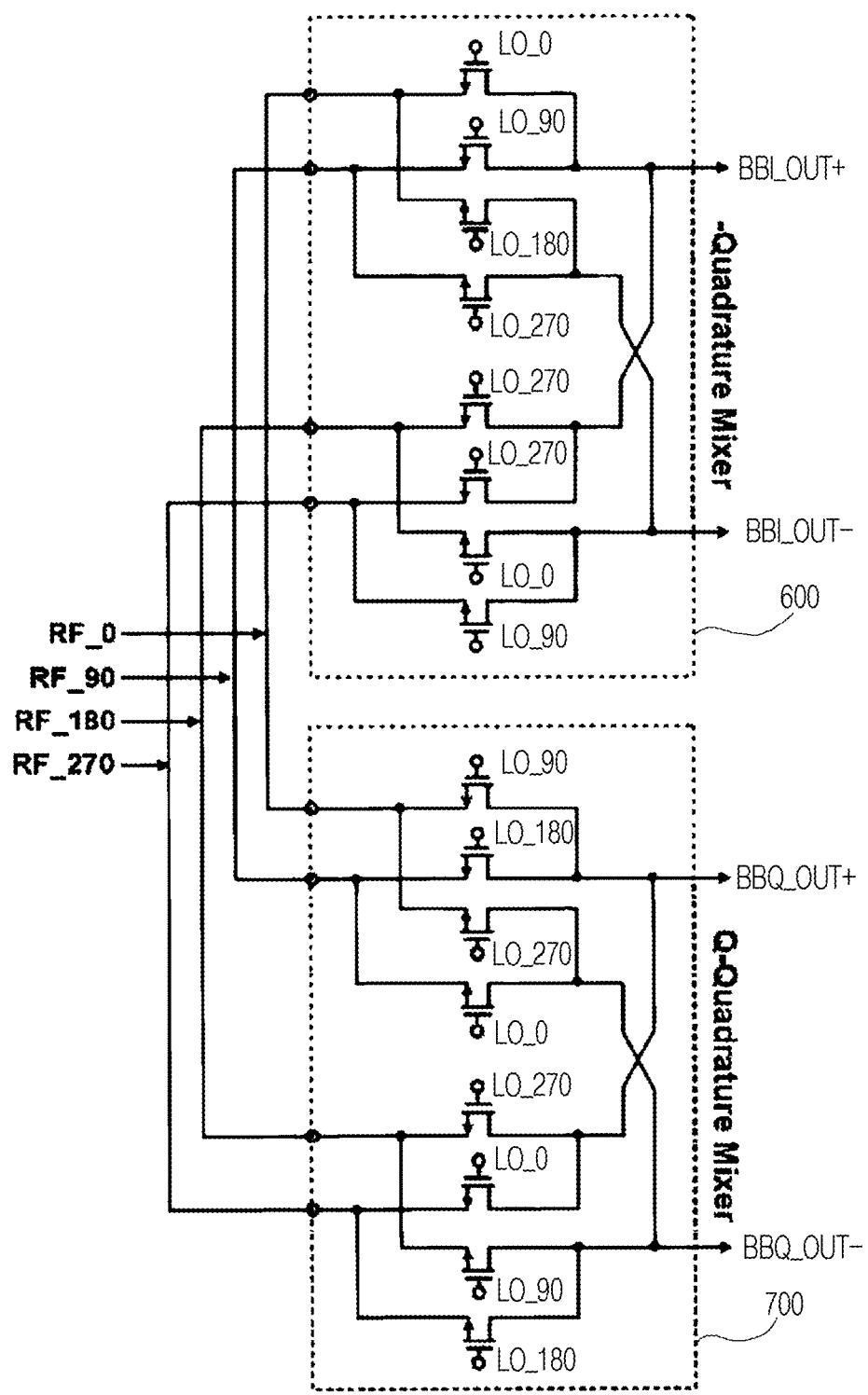
FIG. 7 is a circuit diagram showing an IQ quadrature double-balanced passive mixers according to the embodiment of the present invention.

FIG. 7 is a circuit diagram showing an IQ quadrature double-balanced passive mixers according to the embodiment of the present invention. That is, FIG. 7 shows a connection relationship between the I-quadrature mixer 600 and the Q-quadrature mixer 700, which are applied by I-paths and Q-paths, respectively, according to the embodiment of the present invention.

As shown in FIGS. 6A, 6B, and 7, the I-quadrature mixer 600 and the Q-quadrature mixer 700 according to the embodiment of the present invention may each generate output signals through switching combinations of the RF quadrature input signals RF_0, RF_90, RF_180, and RF_270 and the four LO signals LO_0, LO_90, LO_180, and LO_270, with phase differences at intervals of 90 degrees, respectively.

That is, four RF quadrature input signals RF_0, RF_90, RF_180, and RF_270 generated by the RF quadrature signal generator 200 and four LO signals LO_0, LO_90, LO_180, and LO_270 are selectively connected to each other so as to allow the I-quadrature mixer 600 and the Q-quadrature mixer 700 to generate output signals, each having the same phase.

At this time, the RF quadrature input signals RF_0, RF_90, RF_180, and RF_270 are each applied in common to corresponding inputs of the I-quadrature mixer 600 and the Q-quadrature mixer 700, and four LO quadrature signals LO_0, LO_90, LO_180, and LO_270 are selectively connected to switch gates, respectively, of the I-quadrature mixer 600 and the Q-quadrature mixer 700.

In addition, each of the four RF quadrature signals RF_0, RF_90, RF_180, and RF_270 with phases is connected to the I-quadrature mixer 600 and the Q-quadrature mixer 700 by being shared, and in order to generate a 90 degree angle phase difference between the BBI and BBQ outputs of the I-quadrature mixer 600 and the Q-quadrature mixer 700, the LO quadrature signals LO_0, LO_90, LO_180, and LO_270 are each connected to each corresponding path so that an I-path LO and a Q-path LO corresponding to each other have the 90 degree angle phase difference therebetween.

That is, the frequency may be downconverted by turning on/off each switch of the I-quadrature mixer 600 and the Q-quadrature mixer 700 through the LO quadrature signals LO_0, LO_90, LO_180, and LO_270.

In this case, the LO quadrature signals LO_0, LO_90, LO_180, and LO_270 according to the present invention may be applied to both the I-path of the I-quadrature mixer 600 and the Q-path of the Q-quadrature mixer 700, whereby the frequency may be downconverted.

As such, the I-quadrature mixer 600 and the Q-quadrature mixer 700 according to the exemplary embodiment of the present invention may connect switches of the RF signals and LO signals of the different switching combinations having the output of the same phase together, thereby having an effect wherein random mismatch components that may occur in respective switching operation may be compensated.

That is, the I-quadrature mixer 600 and the Q-quadrature mixer 700 according to the embodiment of the present invention may implement the quadrature passive mixer through various combinations of switching operations and may connect the switching combinations having the output of the same phase to each other, whereby mismatch components and the IM2 components occurring in respective mixing switching operation may cancel each other.

Therefore, the I-quadrature mixer 600 and the Q-quadrature mixer 700 according to the embodiment of the present invention have an effect wherein mismatches that may randomly occur in phase combinations different from each other may compensate each other through use of the quadrature input signals RF_0, RF_90, RF_180, and RF_270 and the LO quadrature signals LO_0, LO_90, LO_180, and LO_270.

For example, in a conventional double-balanced circuit as shown in FIG. 2B, a BB_OUT+ output signal is generated using a mixing signal of combinations of the RF_0 and LO_0 signals and the RF_180 and LO_180 signals.

Similarly, the BB_OUT− output signal is determined by the RF_0 and LO_180 signals and the RF_180 and LO_0 signals. Therefore, when there is a mismatch between LO_0 and LO_180 signals, an IM2 component is generated at the output end.

On the other hand, the I-quadrature mixer 600 and the Q-quadrature mixer 700 according to the embodiment of the present invention, as shown in FIGS. 6A and 6B, to generate a BB_OUT+ output signal, may use the switching combinations of the RF_0 and LO_0, and the RF_180 and LO_180 as well as the switching combinations of the RF_90 and LO_90, and the RF_270 and LO_270.

Accordingly, the I-quadrature mixer 600 and the Q-quadrature mixer 700 according to the embodiment of the present invention may have an output in which an IM2 value due to a mismatch between the LO_90 and LO_270 signals appears at the same time in addition to an IM2 value due to a mismatch between the LO_0 and LO_180 signals.

In this case, assuming that each of phases and magnitude values of the IM2 generated at this time has random value according to a Gaussian distribution, it is possible to obtain result values wherein each IM2 cancels each other.

Figure 8A:
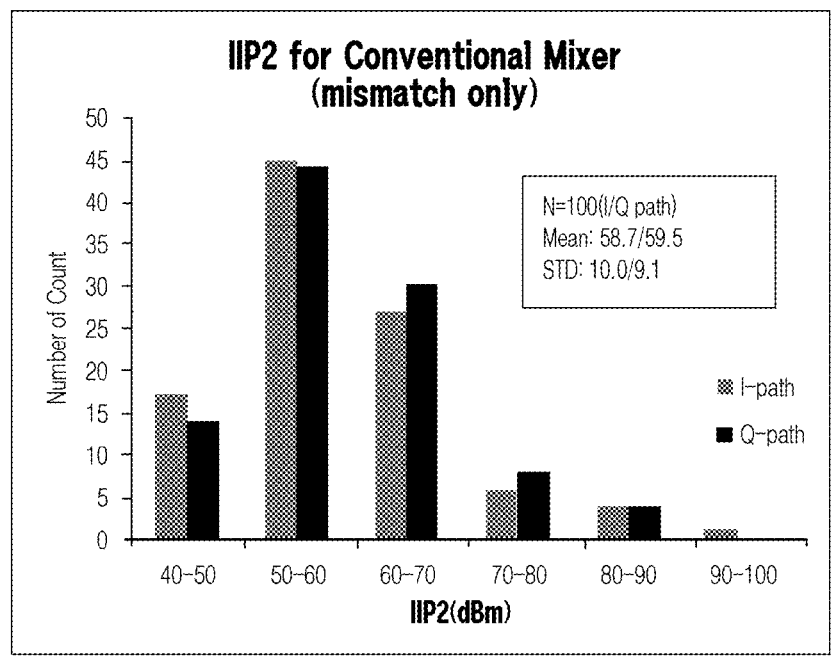
FIGS. 8A and 8B are graphs showing results of simulating conventional passive mixers.
Figure 8B:
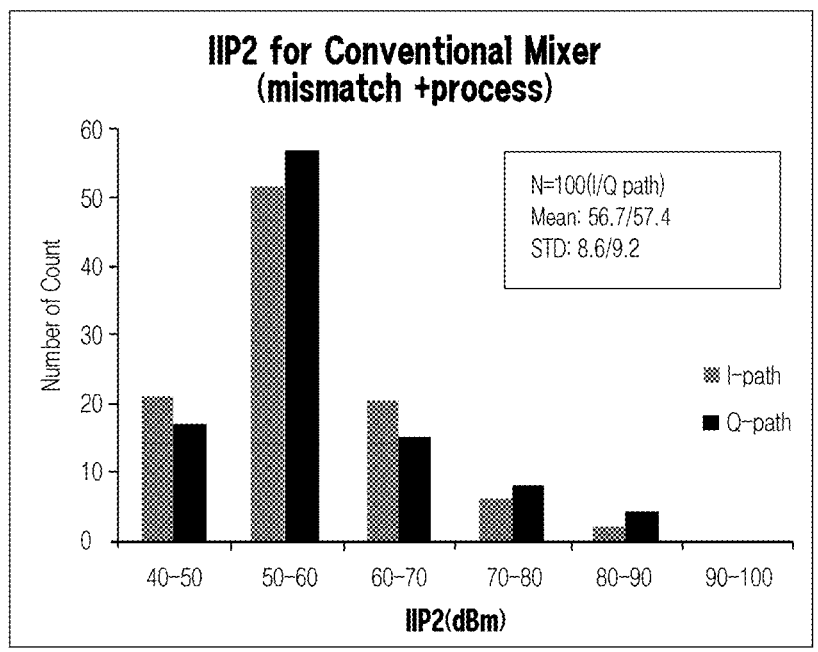
Figure 9A:
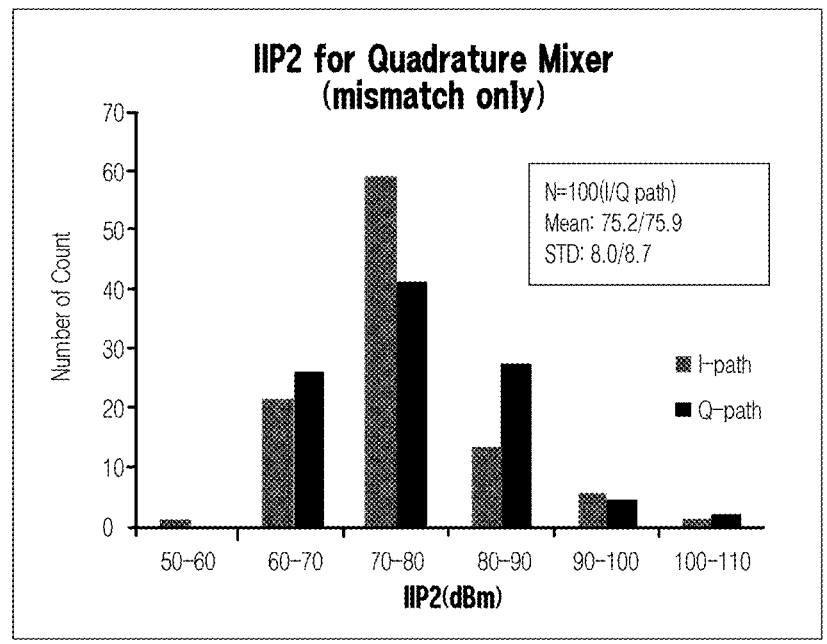
FIGS. 9A and 9B are graphs showing results of simulating the passive mixers according to the embodiment of the present invention.
Figure 9B:
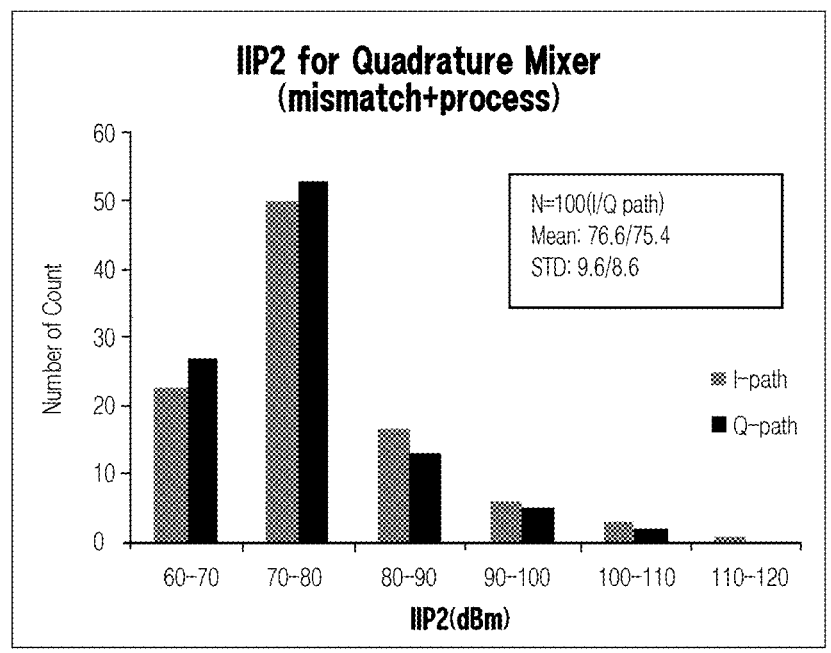

FIGS. 8A and 8B are graphs showing results of simulating the conventional passive mixers, and FIGS. 9A and 9B are graphs showing results of simulating the passive mixers according to the embodiment of the present invention.

That is, FIG. 8A is a graph showing a result of a Monte Carlo IIP2 simulation of the conventional double-balanced passive mixer by applying mismatch components, and FIG. 8B is a graph showing a result of a Monte Carlo IIP2 simulation of the conventional double-balanced passive mixer by applying mismatch components, and dispersion conditions of a semiconductor process.

In addition, FIG. 9A is a graph showing a result of a Monte Carlo IIP2 simulation of the quadrature double-balanced passive mixer 600 and 700 according to the embodiment of the present invention by applying mismatch components, and FIG. 9B is a graph showing a result of a Monte Carlo IIP2 simulation of the quadrature double-balanced passive mixer 600 and 700 according to the embodiment of the present invention by applying mismatch components, and dispersion conditions of a semiconductor process.

To confirm results, a simulation of a mixer designed using a 65 nm CMOS process is performed. In addition, the simulation assumes a long-term evolution (LTE) band 2 (LO frequency, $f_{Lo}$=190 MHz) in cellular wireless communication, and a two-tone (f1=1880 MHz, f2=1881 MHz) of −25 dBm magnitude is applied to check the IIP2 characteristics.

In addition, ±3 σ variation condition is assumed for a mismatch of semiconductor process and a random simulation of the process.

At this time, as shown in FIGS. 8A and 8B and FIGS. 9A and 9B, simulation results all have similar standard deviations (STD=8 to 10 dBm), whereas it may be seen that the average value of the quadrature passive mixers 600 and 700 according to the present invention is about 18 to 20 dBm higher than that of the conventional passive mixer. That is, it may be seen that the IIP2 characteristic of the receiver that determines the IIP2 of the wireless communication system is improved by 18 to 20 dBm on average.

As such, the quadrature passive mixers 600 and 700 according to the exemplary embodiment of the present invention not only provide the IIP2 characteristics due to the random size mismatch of mixer blocks but also have an effect wherein the mismatch caused by the random process mismatch is improved.

In particular, the IIP2 characteristics may be improved without the need for separate calibration time, and the EU component at the mixer output may be significantly reduced. In addition, while the conventional mixer is performed by being optimized for one frequency, the quadrature passive mixers 600 and 700 according to the embodiment of the present invention improve the IIP2 of the mixer itself, thereby having an effect wherein the IIP2 characteristics may be improved at all frequencies.

The exemplary embodiments of the present invention have been described above, but the present invention is not limited to the above embodiments. In addition, the present invention includes all changes to the extent deemed acceptable as equivalents that may be easily changed from the embodiments of the present invention by a person skilled in the art to which the present invention pertains.

What is claimed is:

1. A frequency converter for improving secondary non-linearities, the frequency converter comprising:
   an RF quadrature signal generator receiving amplified signals from a low noise amplifier (LNA) and generating four RF quadrature signals with phase differences at intervals of 90 degrees;
   an LO IQ signal generator generating in-phase (I) and quadrature (Q) local oscillator (LO) signals for frequency conversion of input signals;
   a 25% LO signal generator receiving the signals generated by the LO IQ signal generator and generating 25% duty-cycle LO signals;
   an LO buffer receiving the signals generated by the 25% LO signal generator and selectively transmitting the signals to an I-quadrature mixer or a Q-quadrature mixer; and
   an I-quadrature mixer and a Q-quadrature mixer receiving the RF quadrature signals from the RF quadrature signal generator and selectively frequency-converting the RF quadrature signals for output using to the 25% duty-cycle LO signals applied from the LO buffer.

2. The frequency converter of claim 1, wherein the 25% duty-cycle LO signals are four LO quadrature signals with phase differences at intervals of 90-degrees.

3. The frequency converter of claim 2, wherein the I-quadrature mixer and the Q-quadrature mixer generate output signals by switching combinations of the four RF quadrature signals with phase differences at intervals of 90 degrees and the four LO quadrature signals with phase differences at intervals of 90 degrees.

4. The frequency converter of claim 2, wherein the I-quadrature mixer and the Q-quadrature mixer each are configured to generate the output signals of the same phase, by selectively combining the four RF quadrature signals generated by the RF quadrature signal generator and the four LO quadrature signals to each other.

5. The frequency converter of claim 1, wherein the I-quadrature mixer and the Q-quadrature mixer frequency-converts the RF quadrature signals into baseband frequency signals.

* * * * *

UNITED STATES PATENT AND TRADEMARK OFFICE
CERTIFICATE OF CORRECTION

PATENT NO. : 10,855,226 B1
APPLICATION NO. : 16/923505
DATED : December 1, 2020
INVENTOR(S) : Junghwan Han Page 1 of 1

It is certified that error appears in the above-identified patent and that said Letters Patent is hereby corrected as shown below:

On the Title Page
1. In Item (54), in Title, in Column 1, Line 2, delete "DOWN CONVERTER" and insert -- DOWN-CONVERTER --, therefor.

In the Specification
2. In Column 1, Line 2, delete "DOWN CONVERTER" and insert -- DOWN-CONVERTER --, therefor.
3. In Column 1, Line 40, delete "an the second-order" and insert -- the second-order --, therefor.
4. In Column 1, Line 53, delete "an mismatched" and insert -- a mismatched --, therefor.
5. In Column 2, Lines 38-39, after "generator" delete "RF quadrature signal generator".
6. In Column 4, Line 21, delete "teams" and insert -- terms --, therefor.
7. In Column 7, Line 51, delete "fLo=190" and insert -- fLO=190 --, therefor.
8. In Column 8, Line 8, delete "EU" and insert -- IM2 --, therefor.

In the Claims
9. In Column 8, Line 43, in Claim 1, delete "using to the 25%" and insert -- using the 25% --, therefor.

Signed and Sealed this
Fourth Day of May, 2021

Drew Hirshfeld
*Performing the Functions and Duties of the*
*Under Secretary of Commerce for Intellectual Property and*
*Director of the United States Patent and Trademark Office*